United States Patent [19]

Feng et al.

[11] 4,177,093
[45] Dec. 4, 1979

[54] METHOD OF FABRICATING CONDUCTING OXIDE-SILICON SOLAR CELLS UTILIZING ELECTRON BEAM SUBLIMATION AND DEPOSITION OF THE OXIDE

[75] Inventors: Tom Feng, Morris Plains; Amal K. Ghosh, New Providence, both of N.J.

[73] Assignee: Exxon Research & Engineering Co., Florham Park, N.J.

[21] Appl. No.: 963,023

[22] Filed: Nov. 22, 1978

Related U.S. Application Data

[63] Continuation-in-part of Ser. No. 919,569, Jun. 27, 1978, abandoned.

[51] Int. Cl.$^2$ .................. H01L 21/203; H01L 27/14; H01L 21/26
[52] U.S. Cl. ..................................... 148/174; 29/572; 136/89 SG; 136/89 SJ; 148/1.5; 148/175; 357/4; 357/10; 357/16; 357/30; 357/59; 423/618; 427/35; 427/42; 427/84
[58] Field of Search ........................ 148/174, 175, 1.5; 136/89 SG, 89 SJ; 427/35, 42, 84, 87, 248 C, 255, 372; 29/572; 423/592, 593, 618, 624; 357/4, 10, 16, 30, 59

[56] References Cited

U.S. PATENT DOCUMENTS

| | | | |
|---|---|---|---|
| 3,148,085 | 9/1964 | Wiegmann | 427/42 |
| 3,388,009 | 6/1968 | King | 148/1.5 |
| 3,563,809 | 2/1971 | Wilson | 148/1.5 |
| 3,596,151 | 7/1971 | Eldridge et al. | 357/30 |
| 3,655,428 | 4/1972 | Bragard | 427/42 |
| 3,679,949 | 7/1972 | Uekusa et al. | 357/10 X |
| 3,953,652 | 4/1976 | Addiss et al. | 427/42 X |
| 4,005,468 | 1/1977 | Tanimura et al. | 148/175 X |
| 4,007,473 | 2/1977 | Nonaka et al. | 148/175 X |
| 4,016,586 | 4/1977 | Anderson et al. | 357/16 X |

OTHER PUBLICATIONS

Kajiyama et al., "Electrical and Optical Properties of SnO$_2$-Si Heterojunctions", Jap. J. Appl. Physics, vol. 6, 1967, pp. 905-906.
Lai et al., "In$_2$O$_3$/Si Heterojunction Solar Cells", Conf. Record, 11th IEEE Photospecialist Conf., May 6-8, 1975, pp. 398-401.
Mizrah et al., "Indium-Tin-Oxide . . . Photovoltaic Devices", IEEE Trans. on Electron Devices, vol. Ed-24, No. 4, Apr. 1977, pp. 458-462.
Franz et al., "Heterojunction Solar Cells of SnO$_2$/Si", J. Electronic Materials, vol. 6, No. 2, 1977, pp. 107-123.
DuBow et al., "Efficient Photovoltaic . . . Indium Tin Oxides on Silicon", Applied Physics Letters, vol. 29, No. 8, Oct. 15, 1976, pp. 494-496.
Mizrah et al., "Operation of Ito/Si Heterojunction Solar Cell", Applied Physics Letters, vol. 29, No. 10, Nov. 15, 1976, pp. 682-684.
Anderson, R. L., "Heterojunction Solar Cells", Report NSF/RANN/SE/AER67-04168/PR/77/1,2, Jul. 1977, p. 1.

Primary Examiner—L. Dewayne Rutledge
Assistant Examiner—W. G. Saba
Attorney, Agent, or Firm—Joseph J. Dvorak

[57] ABSTRACT

In preparing tin oxide and indium tin oxide-silicon heterojunction solar cells by electron beam sublimation of the oxide and subsequent deposition thereof on the silicon, the engineering efficiency of the resultant cell is enhanced by depositing the oxide at a predetermined favorable angle of incidence. Typically the angle of incidence is between 40° and 70° and preferably between 55° and 65° when the oxide is tin oxide and between 40° and 70° when the oxide deposited is indium tin oxide.

10 Claims, 4 Drawing Figures

METHOD OF FABRICATING CONDUCTING OXIDE-SILICON SOLAR CELLS UTILIZING ELECTRON BEAM SUBLIMATION AND DEPOSITION OF THE OXIDE

The Government of the United States of America has rights in this invention pursuant to Department of Energy Contract No. EY-76-C-03-1283.

CROSS-REFERENCE TO RELATED APPLICATION

This application is a continuation-in-part of U.S. Ser. No. 919,569, filed June 27, 1978, now abandoned.

BACKGROUND OF THE INVENTION

1. Field of the Invention

This invention relates to the fabrication of semi-conductor devices. Particularly, the present invention relates to a method for consistently preparing high efficiency tin oxide-silicon heterojunction solar cells and indium tin oxide-silicon heterojunction solar cells by deposition of the appropriate oxide from vapor state on N-type silicon.

2. Prior Art

There has been considerable interest in recent years directed toward the development of semiconductive heterojunction devices comprising an electrically conducting transparent window material deposited on a semiconductive substrate. Such interest is based on the potential that such devices can be fabricated at lower costs than homojunction devices based on the conventional diffusion of N and/or P materials into silicon. Additionally, heterojunction conducting oxide devices offer the added advantage that the transparent window permits the transmission of solar radiation directly to the active substrate with little or no attenuation. One such type of heterojunction solar cell proposed is a tin oxide-silicon heterojunction solar cell.

A very early report on a tin oxide-silicon heterostructure solar cell by Kajiyama and Furukawa, Japan Journal Applied Physics, 6, p. 905 (1967) indicated that such a cell had sunlight conversion efficiency of about 0.1%. More recently, however, Franz et al, Journal of Electronic Materials, Vol. 6, No. 2, pp. 107-123 (1977) reported measured sunlight conversion efficiencies for tin oxide-silicon solar cells of close to 10%. Subsequently, Anderson reported to the National Science Foundation, Report NSF/RANN/SE/AER67-04168/PR/77/1,2 (July 1977) that attempts to repeat the previously high sunlight conversion efficiency reported by him, Franz and his coworkers in J. Elec. Mat., supra, for the tin oxide-silicon heterojunction solar cells have been unsuccessful.

Accordingly, it is one of the principal objects of the present invention to provide a method for fabricating high efficiency tin oxide-silicon heterojunction solar cells.

SUMMARY OF THE INVENTION

Briefly stated, it has been discovered that in the deposition of a conducting oxide selected from N-type tin oxide and N-type indium-tin oxide on N-type silicon to produce a heterojunction solar cell, the angle formed by the N-type silicon substrate and the conducting oxide vapor beam is critical to the repeated formation of highly efficient cells, i.e. cells having sunlight conversion efficiencies of greater than about 5% when measured on a solar simulator at 100 MW/cm$^2$. Thus, the present invention constitutes an improvement in the process of preparing conducting oxide-silicon heterojunction solar cells by deposition of the conducting oxide on silicon and wherein N-type silicon semiconductor body is arranged within a vacuum chamber such that the angle of incidence of the oxide vapor stream impinging on the silicon is at a predetermined angle sufficient to provide a maximum in the efficiency of the cell, all other processing conditions being the same. Typically, the predetermined angle is between 40° and 70° and preferably between 55° and 65° when the oxide is tin oxide and between 40° and 70° when the oxide is indium tin oxide. The oxide vapor stream in each instance is generated by electron bombardment of an appropriate oxide powder.

DETAILED DESCRIPTION OF THE INVENTION

Figure 1:
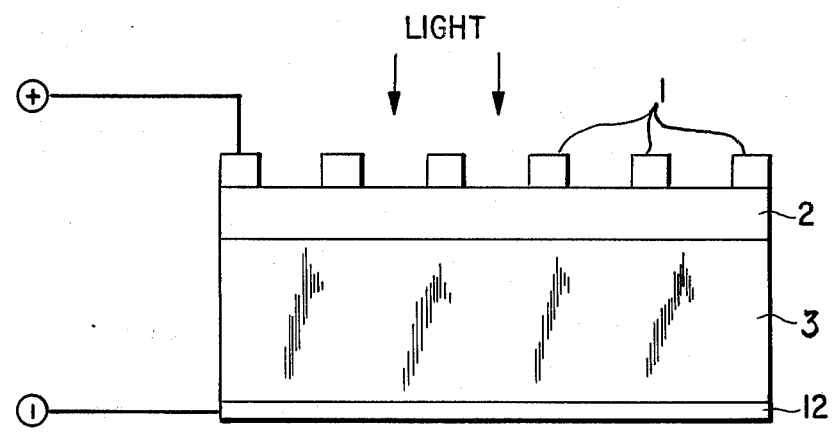
FIG. 1 is a general block diagram of a side view of a heterojunction solar cell according to this invention.

Referring now to FIG. 1, a solar cell of this invention has an N-type transparent conductive oxide layer 2 selected from the group consisting of tin oxide and indium tin oxide on an N-type silicon substrate 3. The thickness of the oxide layer 2 is from about 300 Angstroms to about 2000 Angstroms and preferably about 1000 Angstroms. The cell has metal front contacts or fingers 1 and a back metal electrode 12 formed by well known techniques.

Figure 2:
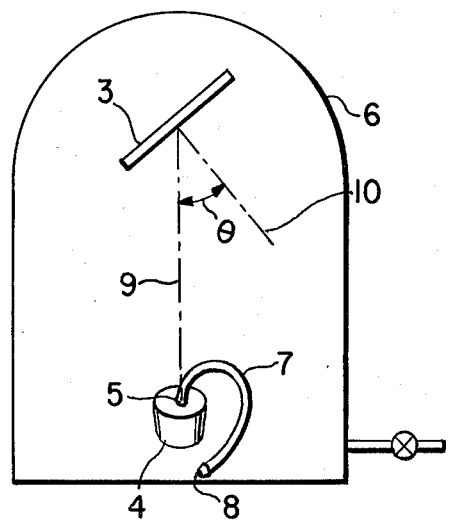
FIG. 2 is a schematic transverse section through an apparatus for putting a process according to the present invention into effect.

According to the present invention, the N-type conductive oxide layer 2 is deposited on the silicon substrate 3 by electron beam evaporation of a source of the oxide. As can be seen in FIG. 2, the conductive oxide powder is contained in vessel 4 located in a vacuum chamber 6. The silicon substrate 3 also is arranged within the vacuum chamber 6 above the vessel 4. As can be seen in the embodiment of FIG. 2, an electron beam 7 generated by source 8 is focused on the conductive oxide 5 in vessel 4, thereby causing its vaporization. The conductive oxide vapor stream is shown schematically as the dotted lines 9.

It has been discovered that the angle of incidence of the conductive oxide vapor stream at the silicon substrate affects the efficiency of the heterojunction solar cell prepared by electron beam deposition of the conducting oxide. Indeed, it is most important that the angle of incidence for any given set of processing conditions, i.e., substrate surface preparation, heating of deposited oxide, electrodes deposited, etc., be sufficient to produce a maximum in the efficiency of the cell. This angle of incidence can be readily determined by selecting a set of cell processing conditions, preparing a series of cells using those processing conditions but varying the angle of incidence, for example from between about 10° to about 80°, in each run of the series and thereafter measuring the sunlight efficiency of the cells so prepared. The predetermined angle of incidence for that series will correspond substantially to the angle used to produce the cell with the maximum efficiency. Generally the angle of incidence is between 40° and 70° and preferably between 55° and 65° when the oxide is tin oxide and between 40° and 70° when the oxide is indium tin oxide. The angle of incidence ($\theta$ in FIG. 2) is the angle between line 9 extending from the center of vessel 4 and a line 10 which is normal to the center of substrate 3.

As will be appreciated by those skilled in the art, prior to placing the silicon substrate 3 in the vacuum chamber 6, the silicon substrate 3 is subjected to a typical cleaning process used in the manufacture of metal oxide semi-conductor devices. For example, the N-type silicon is subjected to one or more cleaning steps such as ultrasonic cleaning, vapor degreasing, rising with deionized water, and the like. Then the silicon substrate 3 is placed in the chamber 6 at an angle relative to the source of conducting oxide such that the angle of incidence, $\theta$, of a conducting oxide vapor stream to be generated in chamber 6 by electron beam 7 will be between about 40° to about 70° and preferably between 55° and 65° when the oxide is tin oxide and between 40° and 70° when the oxide is indium tin oxide.

In the practice of the present invention, commercially available oxidic powders are employed as the material source for the oxide vapo stream. In the instance where the electrically conductive oxide layer to be deposited is tin oxide, the commercially available tin oxide powder is merely loaded in vessel 4 which is first fitted with a graphite crucible insert. In the instance when the conductive oxide layer to be deposited is indium tin oxide, the commercially available tin oxide and indium oxide powders are mixed, for example by ball milling, in the appropriate ratio prior to loading in vessel 4, with its graphite liner. The preferred molar of $In_2O_3$ to $SnO_2$ is 9:1.

After the silicon substrate 3 and the conducting oxide powder 5 are placed in the vacuum chamber 6, the chamber 6 is evacuated, generally to a pressure of about $1\times10^{-6}$ to $1\times10^{-7}$ torr, and the conducting oxide is sublimed by electron beam evaporation heating at sublimation rates of from about 3 Å/sec to 30 Å/sec.

In order to assure that the angle of incidence is not altered by virtue of the electron beam, in effect, digging a crater in the surface of the oxide powder, the electron beam is swept across the surface of the oxide powder by means of an electron beam sweep controller.

After deposition of the oxide, the coated silicon substrate is heated in air at elevated temperatures for a time sufficient to render the deposited oxide conducting. Time and temperature, of course, are interrelated. In general, the higher the heating temperature the shorter the time. Typcially heating is conducted for from about 1 minute to several hours. For example, when the deposited oxide is tin oxide, the coated substrate is heated at temperatures in the range of from about 250° C. to about 350° C. and preferably at 350° C. for about 2.5 minutes. When the deposited oxide is indium tin oxide, temperatures in the range of from about 300° C. to about 400° C. are employed; and preferably the indium tin oxide coated substrate is heated at 350° C. for 30 minutes. Thereafter back contact metallization is accomplished by standard techniques, e.g., by vacuum evaporation of titanium followed by silver. Total metallization is 6000 Å or more in thickness and the titanium layer is approximately 1000 Å thick. Front contact metallization is also done by the same standard technqiues except that a suitable mask with multiple patterns is employed, and the metallized device is then scribed into a plurality of individual cells.

EXAMPLE 1

Following the general procedures outlined hereinabove, a series of tin oxide-silicon solar cells were made and the sunlight engineering conversion efficiencies were measured at 100 MW/cm² in a solar simulator. In each of these tests, the angle of incidence of the tin oxide vapor stream deposited on the silicon was varied. In all runs single crystal silicon wafers were used having the following characteristics:

Type: N-type (phosphorous)
Resistivity: 1 to 3 ohm-cm
Orientation: (100)
Thickness: 10 to 11 mils
Front Surface: Polished
Back Surface: Plain Commercially available $SnO_2$ powder, assay 99.9% pure, was charged into a graphite crucible insert, compacted with a pestle and placed in a four-hearth electro beam source within a vacuum chamber. In each run, the silicon wafer was oriented at the appropriate angle in the vacuum chamber. The chamber was evacuated to a pressure of $10^{-6}$ to $10^{-7}$ torr and the tin oxide was sublimed by heating the oxide with an electron beam. During sublimation the electron beam was swept across the surface of the tin oxide powder by an Airco XYS-8 electron beam sweep controller. In all instances the amount of tin oxide deposited was of the order of about 1000 Å.

After deposition of the $SnO_2$ the coated wafer was removed from the chamber and heated at 350° C. for 2.5 minutes. Then the cells were provided with metal contacts, front and back, consisting of titanium and aluminum films deposited by electron beam evaporation.

Figure 3:
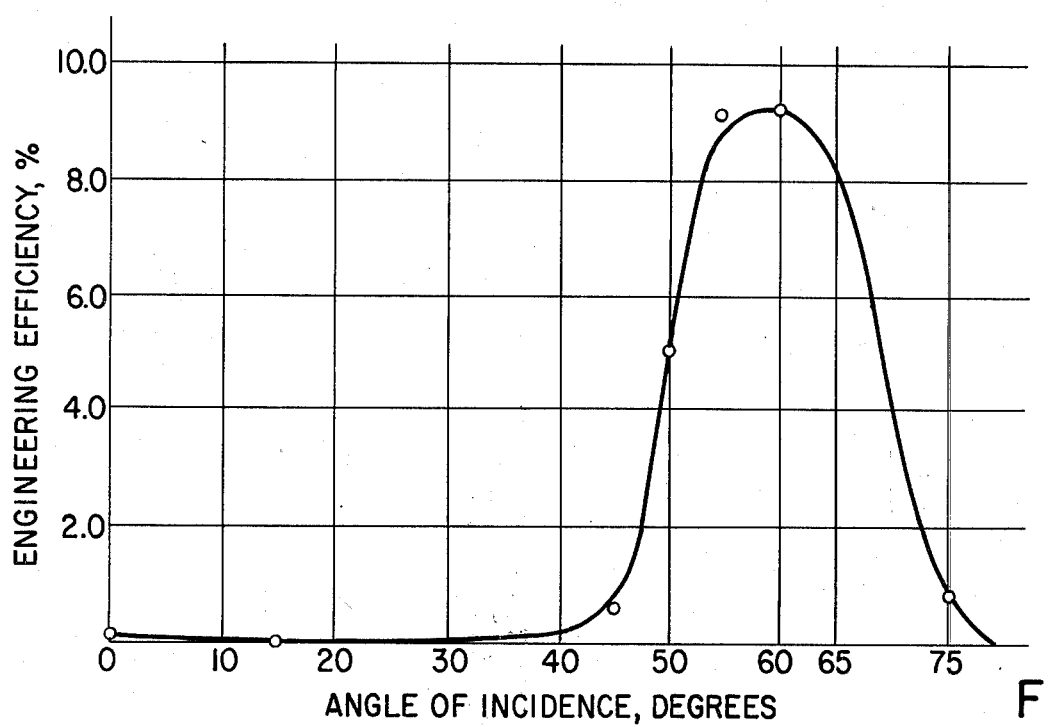
FIG. 3 is a graphic representation showing the effect that the angle of incidence at which tin oxide is deposited on a silicon substrate has on the sunlight engineering efficiency of a SnO$_2$/Si solar cell.

The engineering efficiency was then measured under an AMI spectrum of 100 MW/cm². The resultant efficiencies are shown in FIG. 3.

From the foregoing it is clear that for the above set of processing conditions the angle of incidence for depositing the $SnO_2$ is preferably in the range of 55° to 65° with about 60° most preferred. As should be appreciated, the preferred angle of incidence range for deposition of $SnO_2$ will vary somewhat depending upon other processing conditions such as cleaning, deposition rate, etc. Nonetheless, repetitive tests show that for any given processing condition there is an angle of incidence range for an optimum engineering efficiency range.

EXAMPLE 2

Figure 4:
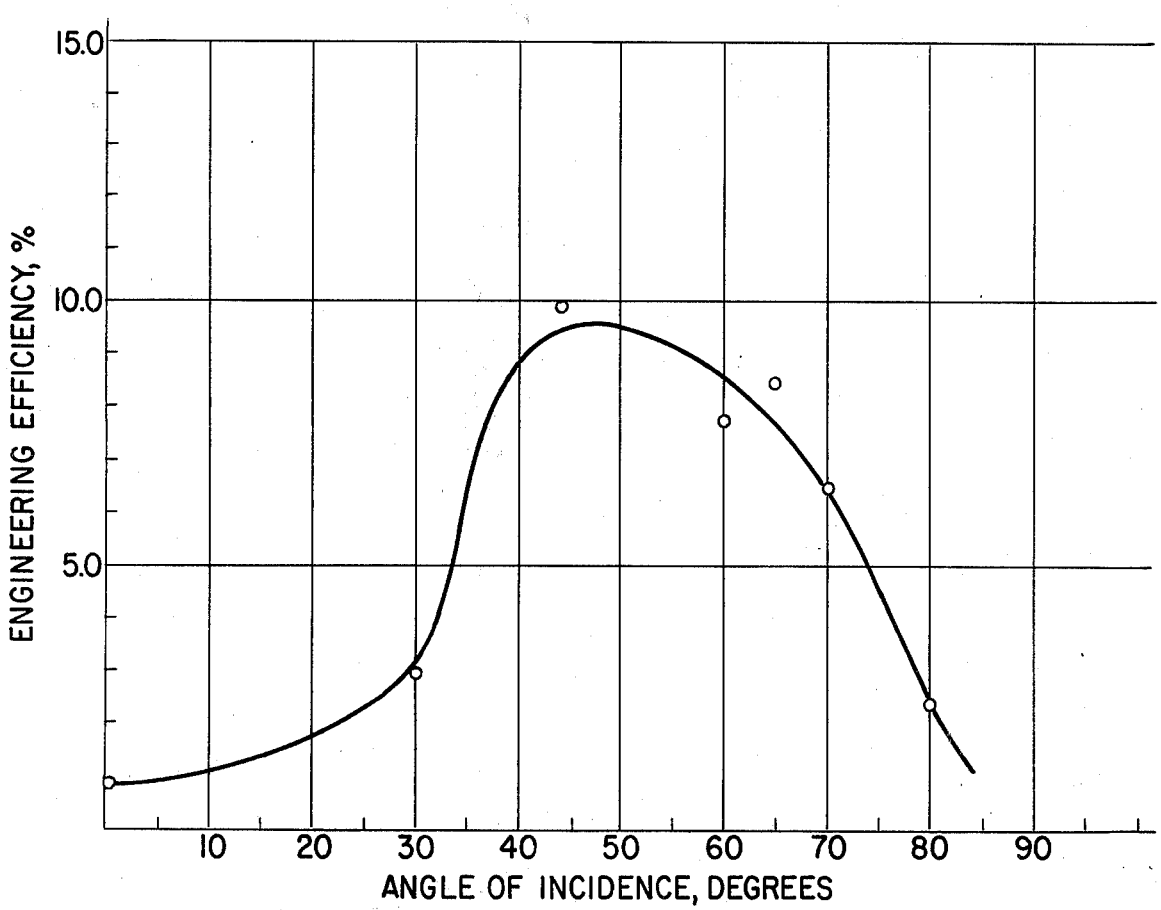
FIG. 4 is a graphic representation showing the effect that the angle of incidence at which an indium tin oxide vapor stream is deposited on a silicon substrate has on the sunlight engineering efficiency of an indium tin oxide/silicon solar cell.

This example follows the procedure of Example 1 except that a mixture containing 90 molar percent $In_2O_3$ and 10 molar percent $SnO_2$ was first prepared by ball milling the commercially available $In_2O_3$ and $SnO_2$ powders. Additionally, after deposition of the oxide, the coated wafer was heated at 350° C. for 60 minutes. The results of these runs are shown in FIG. 4.

What is claimed is:

1. In the process of preparing a heterojunction device having an N-type oxide selected from tin oxide and indium tin oxide coating on N-type silicon substrate by directing an electron beam generated vapor stream of said oxide to impinge on said silicon substrate whereby the oxide is deposited thereon, the improvement comprising directing said vapor stream to impinge on said substrate such that the angle of incidence is sufficient to provide a maximum in the engineering efficiency of the cell wherein said angle of incidence is between 40 and 70.

2. The improvement of claim 1 wherein the oxide is tin oxide and the angle of incidence is between 55° and 65°.

3. The improvement of claim 1 wherein the oxide is indium tin oxide having an indium oxide to tin oxide molar ratio of 9:1 and the angle of incidence is between 40° and 70°.

4. A method of fabricating a heterojunction device having a N-type conducting oxide layer on an N-type silicon substrate comprising:
   (a) providing an N-type silicon semiconductor body in a vacuum chamber;
   (b) providing an oxide powder in said vacuum chamber selected from tin oxide and a mixture of indium oxide and tin oxide having a molar ratio of 9:1;
   (c) evacuating said chamber;
   (d) directing an electron beam nto said oxide powder whereby a stream of oxide vapor is generated;
   (e) directing said stream of oxide vapor to impinge on said silicon body at an angle of incidence ranging from about 40° to about 70° whereby an oxide coating is deposited on said silicon thereby forming a heterojunction device.

5. The method of claim 4 wherein said electron beam is swept across the surface of said oxide whereby the angle of incidence is maintained substantially constant during said deposition of said oxide.

6. The method of claim 5 wherein said stream of oxide vapor is directed to impinge on said substrate for a time sufficient to deposit a layer of said oxide on said substrate ranging from about 300 to about 2000 Angstroms thick.

7. The method of claim 6 wherein said coated substrate is heated in air at from about 250° C. to about 400° C. for a time sufficient to render the oxide coating conductive.

8. The method of claim 7 including deposition of metal electrodes on said coated and heated substrate.

9. The method of claim 8 wherein said oxide is tin oxide and wherein said angle of incidence is between 55° and 65°.

10. The method of claim 8 wherein said oxide powder is a mixture of indium oxide and tin oxide in the molar ratio of 9:1 and wherein the angle of incidence is between 50° and 70°.

* * * * *